United States Patent
Shih et al.

(10) Patent No.: US 8,648,618 B1
(45) Date of Patent: Feb. 11, 2014

(54) METHOD AND MODULE FOR JUDGING STATUS OF POWER SUPPLIES

(71) Applicant: Zippy Technology Corp., New Taipei (TW)

(72) Inventors: Tsun-Te Shih, New Taipei (TW);
Yu-Yuan Chang, New Taipei (TW);
Tsung-Chun Cheng, New Taipei (TW);
Heng-Chia Chang, New Taipei (TW)

(73) Assignee: Zippy Technology Corp., New Taipei (TW)

( * ) Notice: Subject to any disclaimer, the term of this patent is extended or adjusted under 35 U.S.C. 154(b) by 0 days.

(21) Appl. No.: 13/632,882

(22) Filed: Oct. 1, 2012

(51) Int. Cl.
*G01R 31/40* (2006.01)

(52) U.S. Cl.
USPC ............... 324/764.01; 324/762.01; 713/340; 702/108

(58) Field of Classification Search
USPC .......... 324/764.01, 762.01; 702/108; 713/340
See application file for complete search history.

(56) References Cited

U.S. PATENT DOCUMENTS

| | | | |
|---|---|---|---|
| 5,710,701 A * | 1/1998 | Brown ........................... | 700/80 |
| 7,746,094 B2 * | 6/2010 | Zhang et al. .............. | 324/764.01 |
| 8,354,859 B2 * | 1/2013 | Xie ........................... | 324/764.01 |
| 2011/0018580 A1 * | 1/2011 | Tamagawa et al. ...... | 324/764.01 |

* cited by examiner

*Primary Examiner* — Arleen M Vazquez
(74) *Attorney, Agent, or Firm* — Muncy, Geissler, Olds & Lowe, PLLC

(57) ABSTRACT

Method and module for judging status alterations of power supplies that are caused by changes of external power sources are provided. Through comparing first, second and third comparison voltages with a stabilized voltage of a voltage stabilization and energy storage element in a power factor correction unit, the status of the power supply can be judged, and an external power supply abnormal signal, a power supply abnormal signal or a power failure alert signal can be generated according to the status to allow a motherboard to perform loading regulation. The power failure alert signal is used to timely stop operation of the power supply, hence can resolve the problems of the conventional techniques such as delay notification, inaccurate judgment or complex composition of judgment circuit.

18 Claims, 9 Drawing Sheets

METHOD AND MODULE FOR JUDGING STATUS OF POWER SUPPLIES

FIELD OF THE INVENTION

The present invention relates to a method and module for judging status of power supplies and particularly to a method and module for judging status of power supplies through a stabilized voltage of a voltage stabilization and energy storage element in a power factor correction unit.

BACKGROUND OF THE INVENTION

Advance of technology has created greater demand for higher power quality on electronic devices (such as central processors, graphic processors, hard disk drivers and the like). Unstable input power quality causes unstable output power quality of a power supply. The unstable power could cause malfunction of an electronic device, or even cause instant failure of the electronic device in serious situation, thus not only the data during operation may be lost or damaged, also the electronic device may have structural damage.

To avoid abrupt failure of the power supply that might cause unrecoverable damage, nowadays most motherboards require the power supply to provide status information (commonly called PG (Power Good) signal) to perform management and control. In the event that the motherboard receives abnormal status information it starts actions of load reduction, such as lower air fan spinning speed, stop power supply to idled electronic devices or the like to avoid rapid dysfunction of the power supply, meanwhile the motherboard proceeds orderly shutdown of the electronic devices in operation. Please refer to FIG. 1 for conventional power supply architecture. It generally includes a judgment module 17 connecting electrically to a rectification output unit 16 or the secondary side of a transformer 13 of a power supply 1 to receive power to perform status judgment. But external power has to go through a multi-stage circuit (such as a rectification filter unit 11, power factor correction unit 12, primary side of the transformer 13 and the like) to reach the rectification output unit 16 or secondary side of the transformer 13, response time for judgment usually is too late, hence abnormal condition of the external power source 10 cannot be notified instantly to the motherboard 3. To address this issue, some techniques have been proposed to focus on the front end circuit (i.e. the rectification filter unit 11, power factor correction unit 12 or the like) at the primary side of the transformer 13 in the power supply 1 to make inspection result to more match the input end status of the power supply. However, the input end of the power supply usually is at a higher voltage level, but not all electronic elements can withstand high voltage. Moreover, the power supply 1 does not always get DC input. In the event that the power supply 1 gets AC input, a multi-stage filter circuit must be added to the judgment module to eliminate noise signals. This makes the circuit more complex, and transmission of the multi-stage circuit also makes response time longer to result in delay notification. In addition, different AC frequencies also could cause inaccuracy of judgment result. On the other hand, the conventional method for judging status of the power supply merely has one judgment spot, in the event that a slight change happens to the external power source 10, an abnormal signal is output so that it is easily to erroneously judge the failure of the external power source 10.

SUMMARY OF THE INVENTION

The primary object of the present invention is to provide a method and module to accurately judge input end status of a power supply.

Another object of the invention is to resolve the problem of delay notification of the conventional power supply judgment module that performs judgment through the output end voltage of a power supply, and the problem of complex circuit of the judgment module when the power supply gets AC input.

To achieve the foregoing objects, the present invention provides a method for judging status of a power supply. The power supply includes a voltage stabilization and energy storage element located in a power factor correction unit to provide a stabilized voltage upon being activated and a pulse width control unit to drive the power supply to perform power conversion. The power supply is electrically connected to a motherboard. The method includes the steps of:

a) establishing comparison voltages: establishing a first comparison voltage, a second comparison voltage smaller than the first comparison voltage and a third comparison voltage smaller than the second comparison voltage;

b) getting the stabilized voltage: getting the stabilized voltage of the voltage stabilization and energy storage element during operation of a power supply;

c) judging external power supply: comparing the stabilized voltage with the first comparison voltage, and judging the external power supply in an abnormal state when the stabilized voltage is smaller than the first comparison voltage and generating an external power supply abnormal signal sent to the motherboard;

d) judging power supply performance: comparing the stabilized voltage with the second comparison voltage, and judging the power supply performance in an abnormal state when the stabilized voltage is smaller than the second comparison voltage and generating a power supply abnormal signal sent to the motherboard; and e) judging power failure: comparing the stabilized voltage with the third comparison voltage, and judging the power in a failure state when the stabilized voltage is smaller than the third comparison voltage and generating a power failure alert signal sent to the pulse width control unit of the power supply.

In one embodiment the step of establishing the comparison voltages is preceded by a step of generating the comparison voltages via voltage division by receiving a reference voltage which goes through a comparison voltage generation circuit to generate the first, second and third comparison voltages through voltage division.

In another embodiment the step of establishing the comparison voltages further includes a step of generating the first comparison voltage via voltage division by receiving a reference voltage which goes through a first comparison voltage generation circuit to generate the first comparison voltage through voltage division.

In yet another embodiment the step of establishing the comparison voltages further includes a step of generating the second comparison voltage via voltage division by receiving a reference voltage which goes through a second comparison voltage generation circuit to generate the second comparison voltage through voltage division.

In yet another embodiment the step of establishing the comparison voltages further includes a step of generating the third comparison voltage via voltage division by receiving a reference voltage which goes through a third comparison voltage generation circuit to generate the third comparison voltage through voltage division.

In yet another embodiment the step of getting a stabilized voltage further includes a step of voltage division and equivalent by receiving the stabilized voltage which goes through an equivalent stabilized voltage generation circuit to generate an equivalent stabilized voltage through voltage division.

To achieve the foregoing objects, the invention also provides a module for judging status of a power supply. The power supply includes a voltage stabilization and energy storage element which receives electric power output from a power factor correction unit and provides a stabilized voltage, and a pulse width control unit to drive the power supply to perform power conversion. The power supply is electrically connected to a motherboard. The module includes an external power supply inspection unit, a power supply performance inspection unit and a power failure inspection unit. The external power supply inspection unit includes a first comparison voltage and is electrically connected to the voltage stabilization and energy storage element and motherboard to receive the stabilized voltage from the voltage stabilization and energy storage element to compare with the first comparison voltage and generate an external power supply abnormal signal sent to the motherboard. The power supply performance inspection unit includes a second comparison voltage and is electrically connected to the voltage stabilization and energy storage element and motherboard to receive the stabilized voltage from the voltage stabilization and energy storage element to compare with the second comparison voltage and generate a power supply abnormal signal sent to the motherboard. The power failure inspection unit includes a third comparison voltage and is electrically connected to the voltage stabilization and energy storage element and pulse width control unit to receive the stabilized voltage from the voltage stabilization and energy storage element to compare with the third comparison voltage and generate a power failure alert signal sent to the pulse width control unit.

In one embodiment the module includes a comparison voltage generation circuit which is electrically connected to the external power supply inspection unit, power supply performance inspection unit and power failure inspection unit, and receives a reference voltage from the power supply to respectively generate the first, second and third comparison voltages.

In another embodiment the module includes a first comparison voltage generation circuit which is electrically connected to the external power supply inspection unit and receives a reference voltage from the power supply to generate the first comparison voltage through voltage division.

In yet another embodiment the module includes a second comparison voltage generation circuit which is electrically connected to the power supply performance inspection unit and receives a reference voltage from the power supply to generate the second comparison voltage through voltage division.

In yet another embodiment the module includes a third comparison voltage generation circuit which is electrically connected to the power failure inspection unit and receives a reference voltage from the power supply to generate the third comparison voltage through voltage division.

In yet another embodiment the module includes an equivalent stabilized voltage generation circuit which is electrically connected to the voltage stabilization and energy storage element to receive the stabilized voltage and convert the stabilized voltage into an equivalent stabilized voltage through voltage division sent to the external power supply inspection unit, power supply performance inspection unit and power failure inspection unit.

In yet another embodiment the external power supply inspection unit, power supply performance inspection unit and power failure inspection unit are respectively a logic circuit.

In yet another embodiment the external power supply inspection unit, power supply performance inspection unit and power failure inspection unit are respectively a comparator.

Compared with the conventional techniques, the method and module for judging status of the power supply of the invention provide features as follows:

1. The status of the power supply can be quickly and accurately judged. By performing judgment and comparison through the stabilized voltage of the voltage stabilization and energy storage element in the power factor correction unit, compared with the conventional techniques, the invention can get the stabilized voltage through circuit with fewer stages, hence response time is shorter and alterations of the stabilized voltage also better match variations of AC input, thereby more accurate judgment can be made.

2. Circuit is simpler. Although the inspection and judgment are performed at the input end of the power supply, the logic elements are incorporated with the voltage division circuit, hence the circuit of the whole judgment module is simpler.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 2:
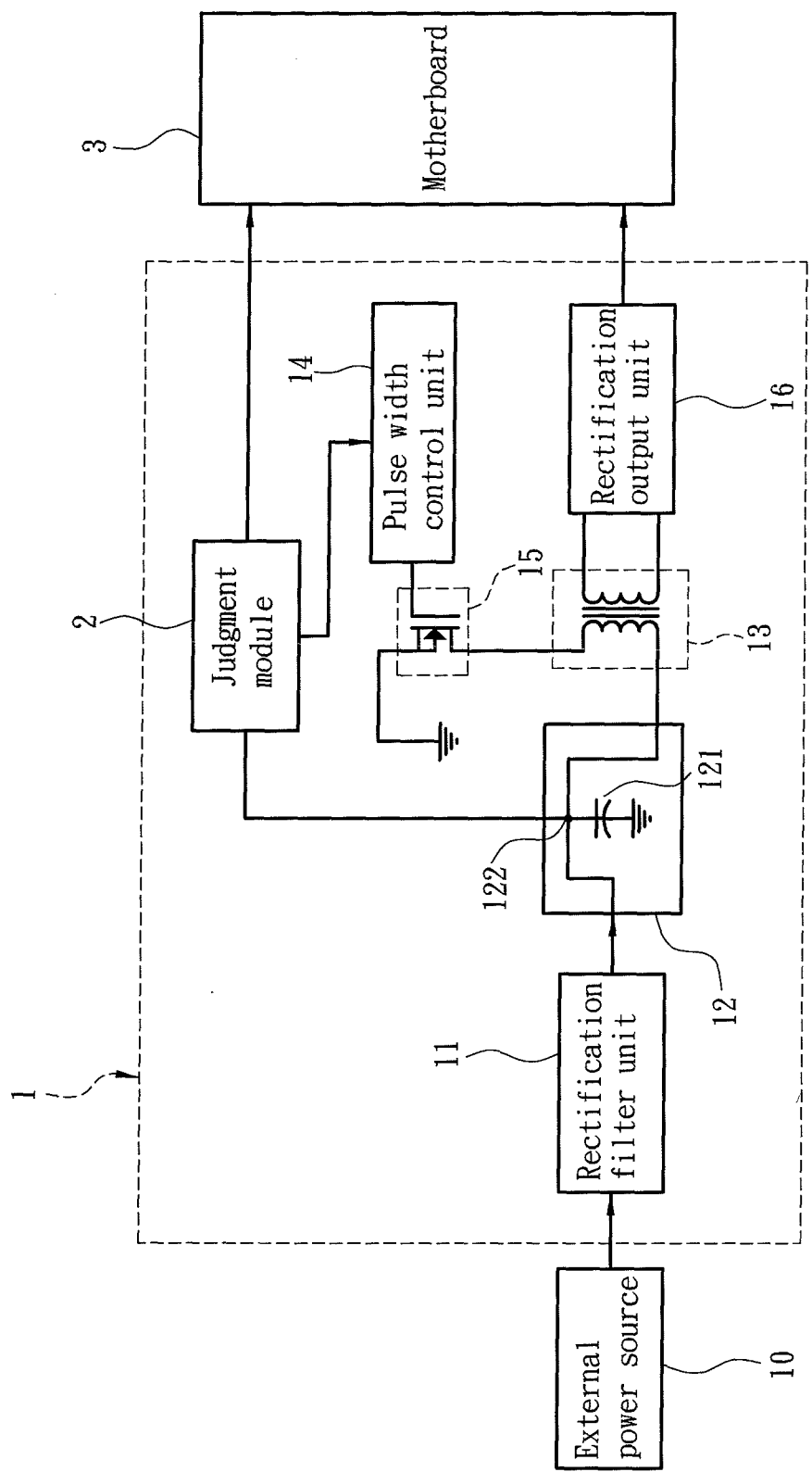
FIG. 2 is a schematic circuit block diagram of a first embodiment of a module for judging status of a power supply according to the invention.
Figure 3:
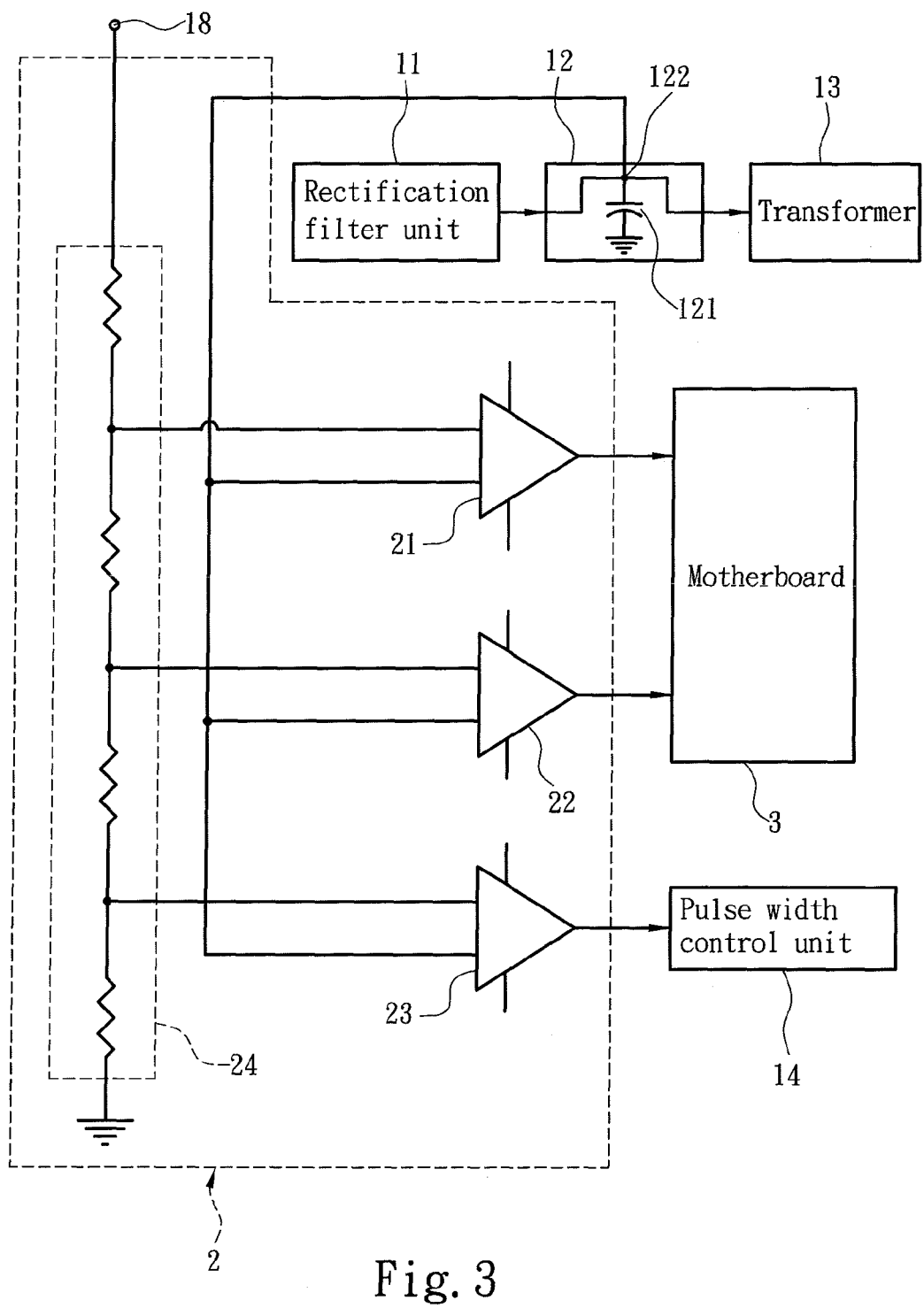
FIG. 3 is another schematic circuit block diagram of the first embodiment of the module for judging status of the power supply according to the invention.

Please refer to FIGS. 2 and 3 for the circuit block diagram of a first embodiment of a module for judging status of a power supply according to the invention. It is used on a power supply 1. The power supply 1 generally includes a rectification filter unit 11 connecting to an external power source 10, a power factor correction unit 12 connecting to the rectification filter unit 11, a transformer 13, a pulse width control unit 14, a switch element 15 and a rectification output unit 16. The power factor correction unit 12 includes a voltage stabilization and energy storage element 121. The external power source 10 outputs AC power which passes through the rectification filter unit 11 to be converted into DC power with the power factor and voltage thereof regulated via a power transformation level in the power factor correction unit 12. The voltage stabilization and energy storage element 121 receives and stores the DC power, and generates a stabilized voltage 122 based on the voltage of the DC power. The switch element 15 has its duty cycle controlled by the pulse width control unit 14 to regulate the coil current passing through the transformer 13. Finally an operation power is generated through the rectification output unit 16 and sent to a motherboard 3.

The judgment module 2 of the invention includes an external power supply inspection unit 21, a power supply performance inspection unit 22 and a power failure inspection unit 23. The external power supply inspection unit 21, power supply performance inspection unit 22 and power failure inspection unit 23 are electrically connected to the voltage stabilization and energy storage element 121 in the power factor correction unit 12 to receive the stabilized voltage 122 during operation of the power supply 1. The external power supply inspection unit 21, power supply performance inspection unit 22 and power failure inspection unit 23 can be respectively a logic circuit or a comparator to generate a signal after operation. The signal will be discussed in detail later.

The external power supply inspection unit 21 and power supply performance inspection unit 22 are connected to the motherboard 3. The power failure inspection unit 23 is connected to the pulse width control unit 14. The aforesaid signal is sent to the motherboard 3 and pulse width control unit 14. The external power supply inspection unit 21 has a first comparison voltage comparing with the stabilized voltage 122. The power supply performance inspection unit 22 has a second comparison voltage comparing with the stabilized voltage 122. The power failure inspection unit 23 has a third comparison voltage comparing with the stabilized voltage 122. Furthermore, the judgment module 2 can include a comparison voltage generation circuit 24 electrically connected to the external power supply inspection unit 21, power supply performance inspection unit 22 and power failure inspection unit 23 to respectively generate the first, second and third comparison voltages. In practice, the comparison voltage generation circuit 24 can be a voltage division circuit to receive a reference voltage 18 from the power supply 1 and perform voltage division to generate the first, second and third comparison voltages at different voltage division sections. Generation of the comparison voltages through voltage division is a technique known in the art, thus details are omitted herein. The reference voltage 18 mentioned in the invention can be standby power (generally called VSTB) generated by the power supply 1, but this is not the limitation. In this embodiment, the first, second and third comparison voltages are generated by a single voltage division circuit, but this also is not the limitation of the invention.

Figure 4:
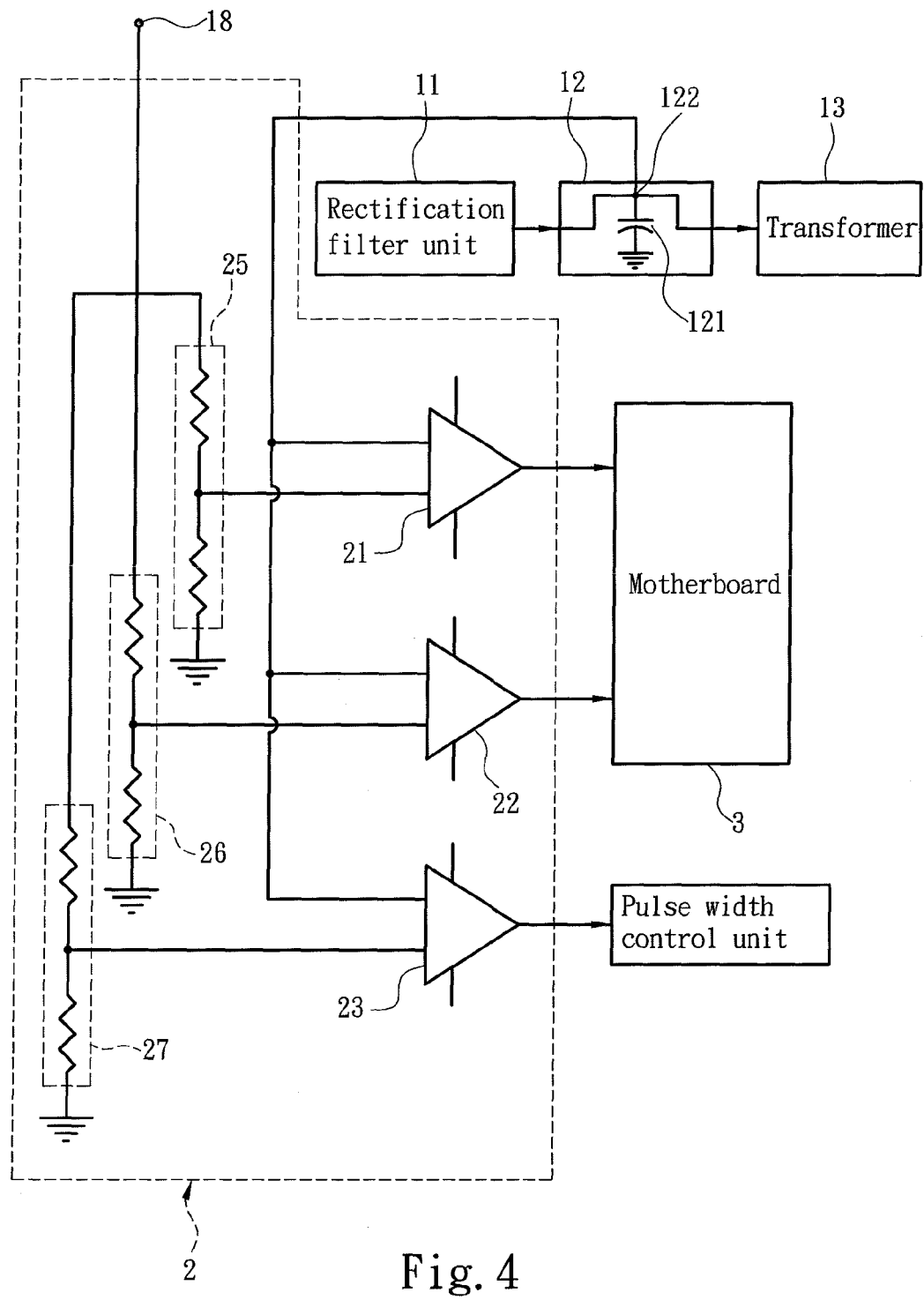
FIG. 4 is a schematic circuit block diagram of a second embodiment of the module for judging status of the power supply according to the invention.

Please refer to FIG. 4 for the circuit block diagram of a second embodiment of the module for judging status of the power supply according to the invention. The judgment module 2 includes a first comparison voltage generation circuit 25 electrically connected to the external power supply inspection unit 21, a second comparison voltage generation circuit 26 electrically connected to the power supply performance inspection unit 22 and a third comparison voltage generation circuit 27 electrically connected to the power failure inspection unit 23. The first, second and third comparison voltage generation circuits 25, 26 and 27 get the reference voltage 18 from the power supply 1 to generate the first, second and third comparison voltages after voltage division.

Figure 5:
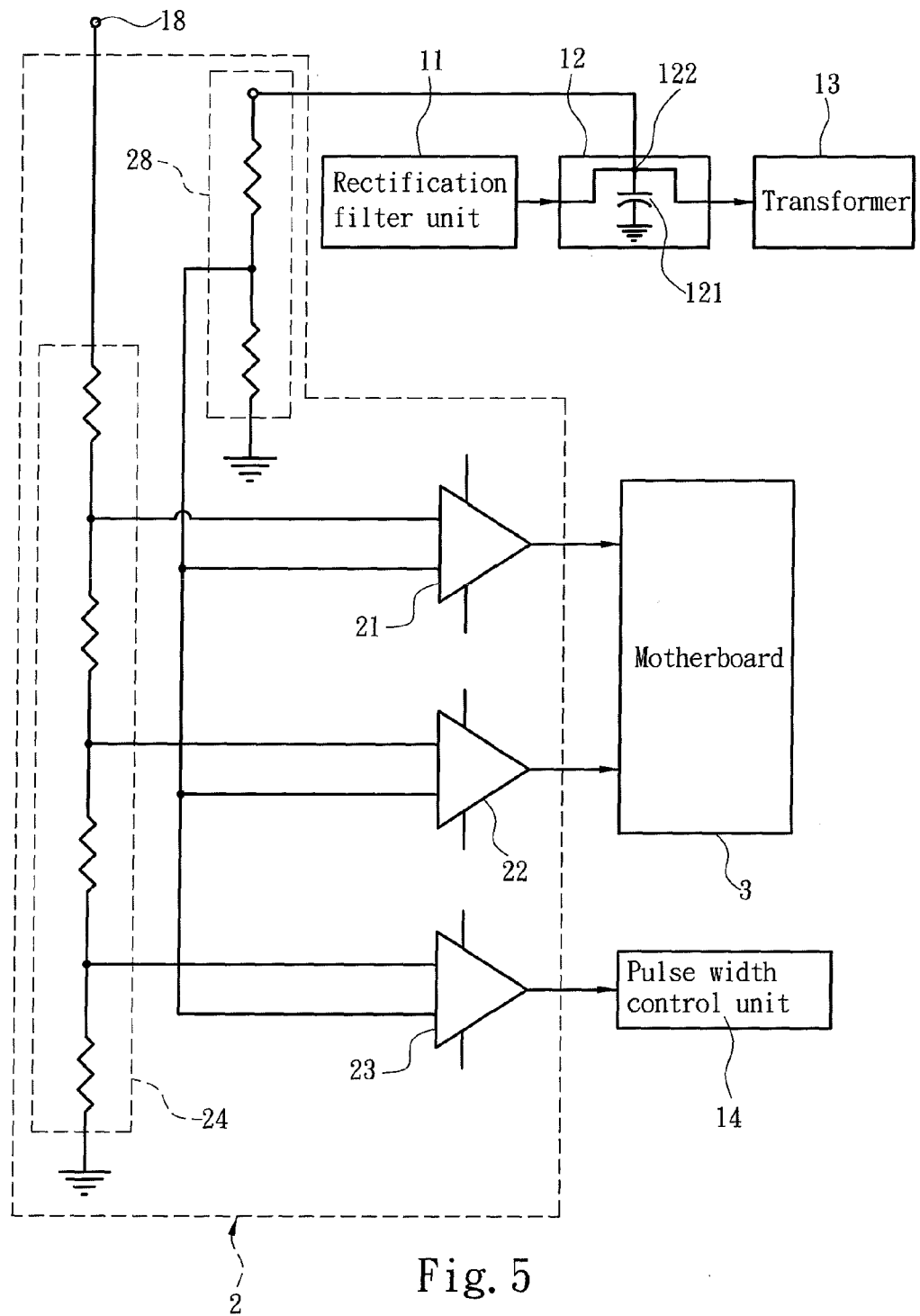
FIG. 5 is a schematic circuit block diagram of a third embodiment of the module for judging status of the power supply according to the invention.

Please refer to FIG. 5 for the circuit block diagram of a third embodiment of the module for judging status of the power supply according to the invention. The general power supply 1 has AC input and DC output. In the event that the input AC power has an effective Root Mean Square (RMS) value of 220V, the voltage of the storage energy in the voltage stabilization and energy storage element 121 could reach 311V during conversion. If the external power supply inspection unit 21, power supply performance inspection unit 22 and power failure inspection unit 23 cannot withstand the power at so high voltage, the judgment module 2 of the invention further includes an equivalent stabilized voltage generation circuit 28 which is electrically connected to the voltage stabilization and energy storage element 121, external power supply inspection unit 21, power supply performance inspection unit 22 and power failure inspection unit 23. The equivalent stabilized voltage generation circuit 28 can be a voltage division circuit to receive the stabilized voltage 122 from the voltage stabilization and energy storage element 121, and perform voltage division to generate an equivalent stabilized voltage. The ratio of the equivalent stabilized voltage and stabilized voltage 122 is determined by the design of the aforesaid comparison voltage generation circuit 24 or first, second and third comparison voltage generation circuits 25, 26 and 27 to ensure accurate judgment. The equivalent stabilized voltage generation circuit 28 can also be implemented in the first and second embodiments previously discussed.

Figure 1:
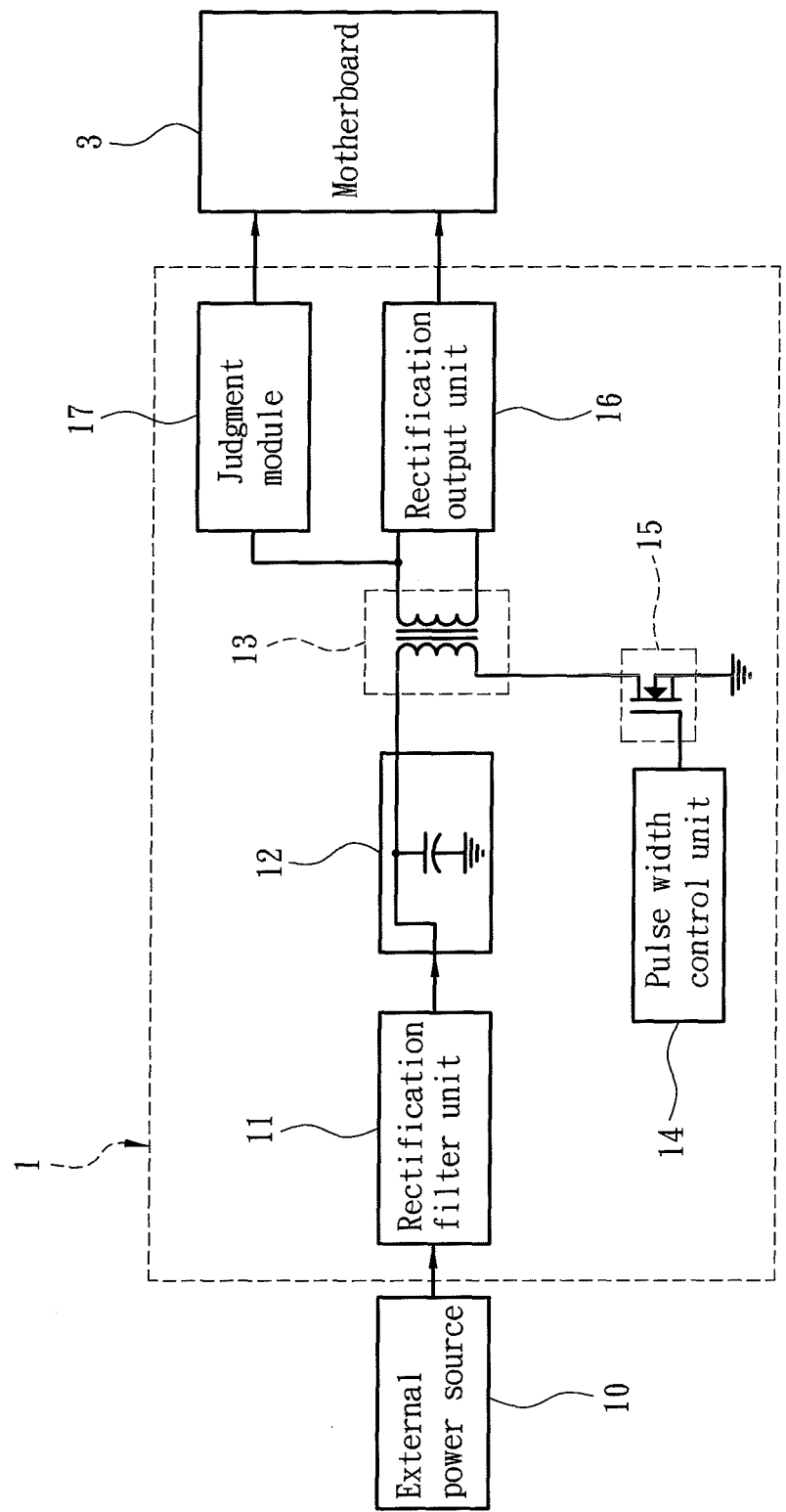
FIG. 1 is a schematic circuit block diagram for status judgment of a conventional power supply.
Figure 6:
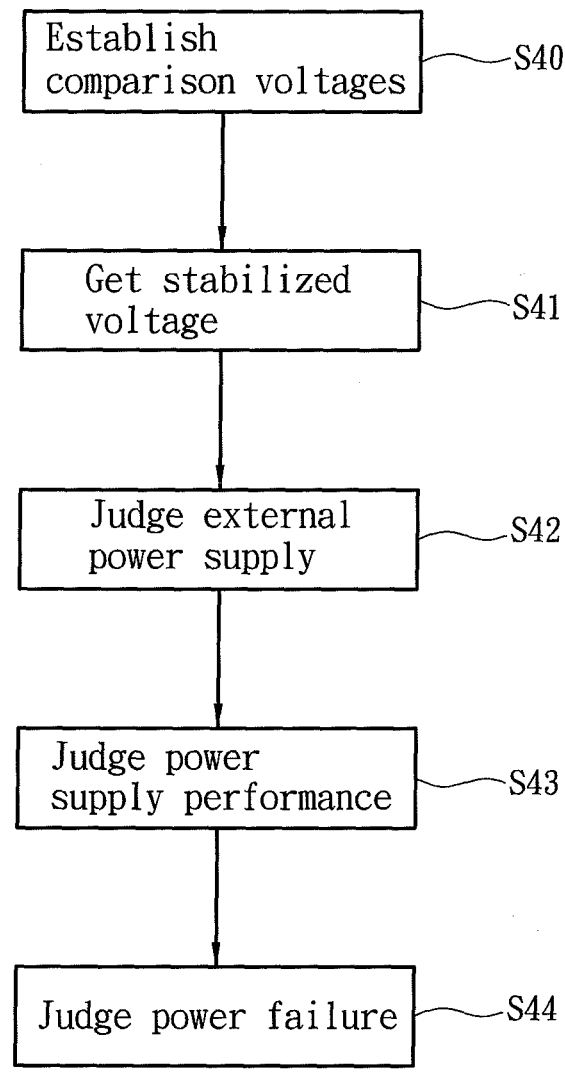
FIG. 6 is a flowchart of a first embodiment of a method for judging status of a power supply according to the invention.

Also referring to FIGS. 1 and 2, in addition to the judgment module 2, the invention also provides a judgment method implemented through the judgment module 2. Please refer to FIG. 6 for the flowchart of a first embodiment of the method for judging status of the power supply according to the invention. It includes the steps as follows:

a) establishing comparison voltages S40: first, establishing a first comparison voltage, a second comparison voltage smaller than the first comparison voltage and a third comparison voltage smaller than the second comparison voltage. The external power supply inspection unit 21 has the first comparison voltage, the power supply performance inspection unit 22 has the second comparison voltage, and the power failure inspection unit 23 has the third comparison voltage;

b) getting a stabilized voltage S41: the external power supply inspection unit 21, power supply performance inspection unit 22 and power failure inspection unit 23 are electrically connected to the voltage stabilization and energy storage element 121 to get a stabilized voltage 122 generated during operation of the power supply 1;

c) judging external power supply S42: after the external power supply inspection unit 21 has received the stabilized voltage 122, it compares the stabilized voltage 122 with the first comparison voltage; if the stabilized voltage 122 is smaller than the first comparison voltage, the external power supply inspection unit 21 generates an external power supply abnormal signal and judges the external power supply in an abnormal state, and sends the external power supply abnormal signal to a motherboard 3 to make a corresponding response;

d) judging power supply performance S43: after the power supply performance inspection unit 22 has received the stabilized voltage 122, it compares the stabilized voltage 122 with the second comparison voltage; if the stabilized voltage 122 is smaller than the second comparison voltage, the power supply performance inspection unit 22 generates a power supply abnormal signal and judges the power supply performance in an abnormal state, and sends the power supply abnormal signal to the motherboard 3 to make a corresponding response; and e) judging power failure S44: after the power failure inspection unit 23 has received the stabilized voltage 122, it compares the stabilized voltage 122 with the third comparison voltage; if the stabilized voltage 122 is smaller than the third comparison voltage, the power failure inspection unit 23 generates a power failure alert signal and judges the power in a failure state, and sends the power failure alert signal to the pulse width control unit 14 to make a corresponding response, such as stopping operation of the pulse width control unit 14. For instance, in an embodiment the pulse width control unit 14 outputs a pulse signal necessary for switching operation of the switch element 15. After the pulse width control unit 14 has received the power failure alert signal, it stops outputting the pulse signal needed for the switching operation of the switch element 15, thereby also stops operation of the power supply 1.

More specifically, in the event that the external power source 10 connected to the power supply 1 cannot supply power normally due to outside factors, input power received by the power supply 1 also decreases. When the voltage level of the external power source 10 drops continuously to allow the stabilized voltage 122 to become smaller than the first comparison voltage, the external power supply inspection unit 21 outputs the external power supply abnormal signal to notify the motherboard 3 that the power supply 1 enters an external power supply abnormal state. If the abnormal state of the external power source 10 deteriorates and causes efficiency of the power supply 1 drop to allow the stabilized voltage 122 to become smaller than the second comparison voltage, the power supply performance inspection unit 22 outputs the power supply abnormal signal to notify the motherboard 3 that the power supply 1 enters the performance abnormal state and cannot supply power anymore, such that the motherboard 3 can perform loading regulation. In the event that the external power source 10 has serious abnormal problems or even in a dysfunction state, and the stabilized voltage 122 is smaller than the third comparison voltage, the power failure inspection unit 23 outputs the power failure alert signal to make the pulse width control unit 14 stop outputting the pulse signal so that the power supply 1 stops operation.

Figure 7:
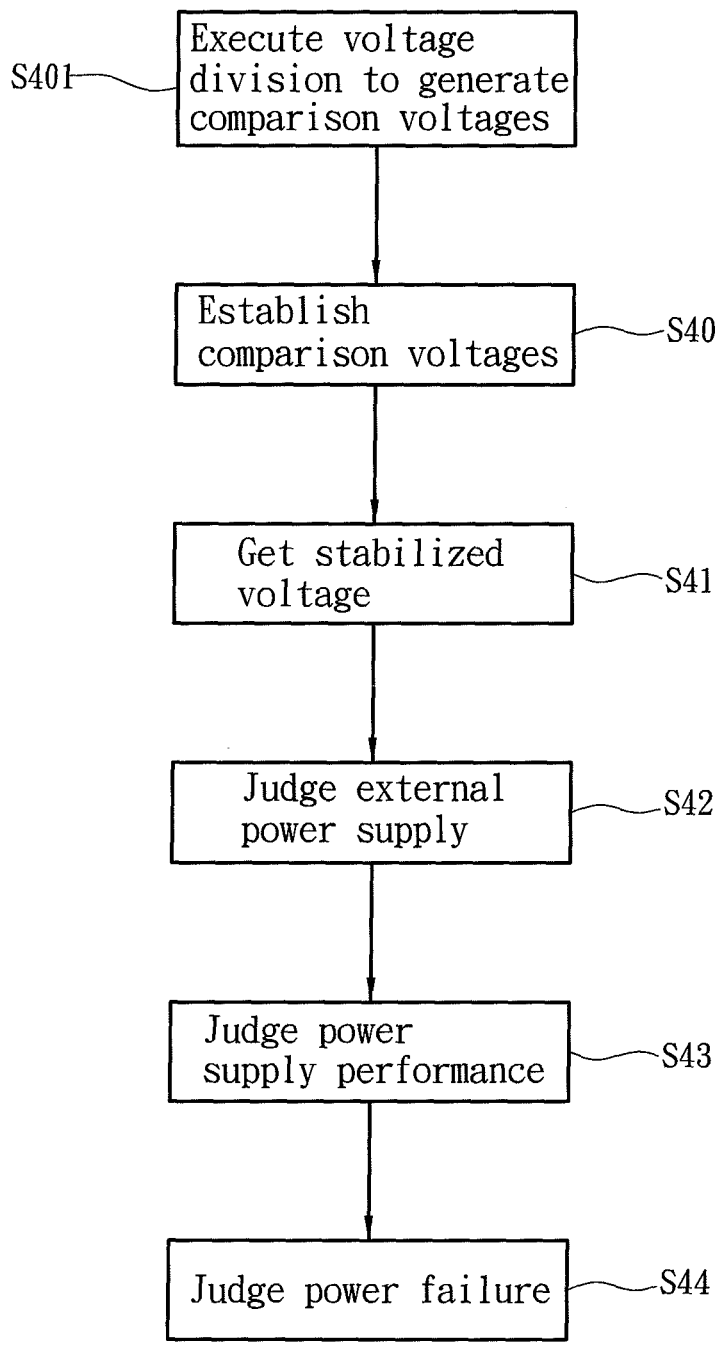
FIG. 7 is a flowchart of a second embodiment of the method for judging status of the power supply according to the invention.
Figure 8:
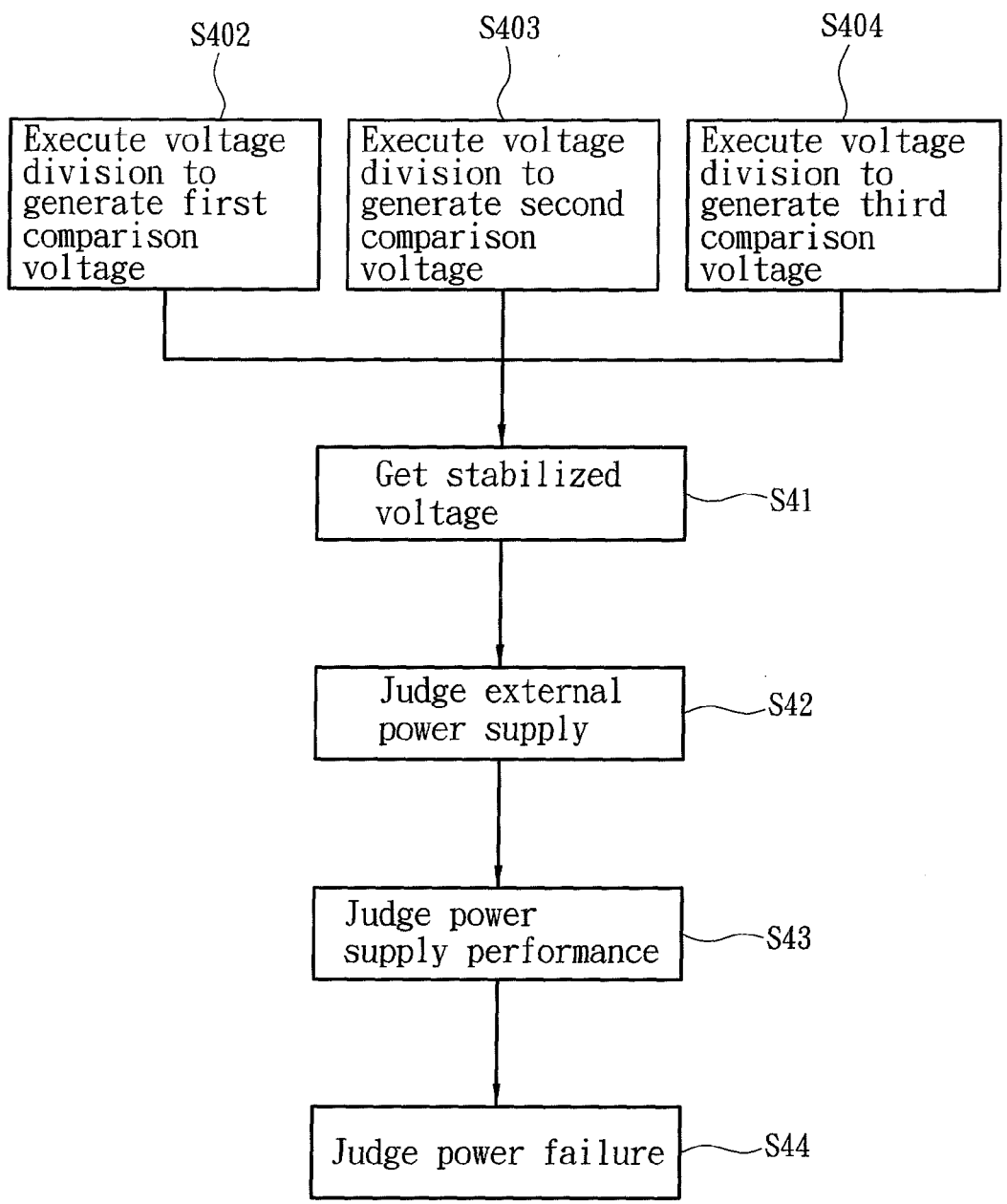
FIG. 8 is a flowchart of a third embodiment of the method for judging status of the power supply according to the invention.

Please refer to FIGS. 7 and 8 for the flowcharts of second and third embodiments of the method for judging status of the power supply according to the invention. As previously discussed, the invention provides two implementation approaches to generate the first, second and third comparison voltages. In the event that they are generated via the comparison voltage generation circuit 24, the step of establishing the comparison voltages S40 includes another step S401 of generating comparison voltages via voltage division, in which the comparison voltage generation circuit 24 receives the reference voltage generated by the power supply 1, and performs voltage division to generate the first, second and third comparison voltages. On the other hand, if the comparison voltages are generated via voltage division through the first, second and third comparison voltage generation circuits 25, 26 and 27, the step of establishing the comparison voltages S40 includes a step of generating the first comparison voltage via voltage division S402, a step of generating the second comparison voltage via voltage division S403 and a step of generating the third comparison voltage via voltage division S404. At the step of generating the first comparison voltage via voltage division S402, after the first comparison voltage generation circuit 25 has received the reference voltage, voltage division is performed to generate the first comparison voltage. At the step of generating the second comparison voltage via voltage division S403, after the second comparison voltage generation circuit 26 has received the reference voltage, voltage division is performed to generate the second comparison voltage. At the step of generating the third comparison voltage via voltage division S404, after the third comparison voltage generation circuit 27 has received the reference voltage, voltage division is performed to generate the third comparison voltage.

Figure 9:
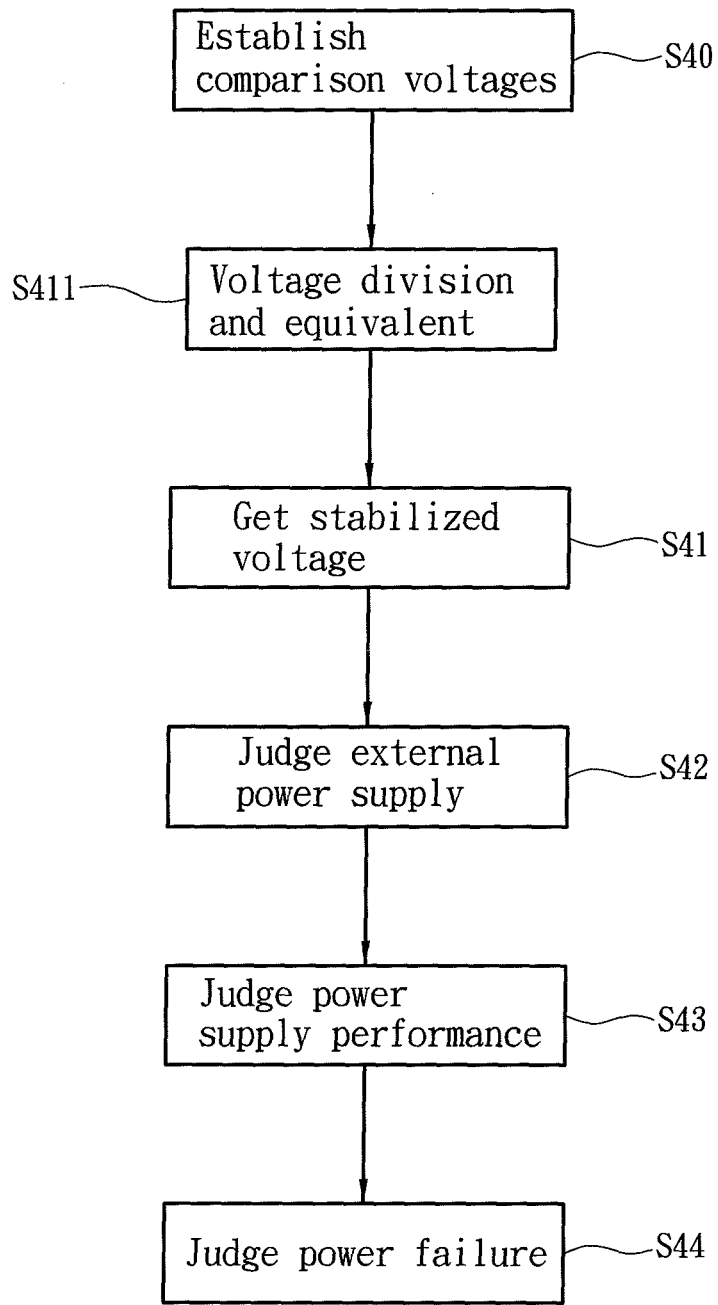
FIG. 9 is a flowchart of a fourth embodiment of the method for judging status of the power supply according to the invention.

Please refer to FIG. 9 for the flowchart of a fourth embodiment of the method for judging status of the power supply according to the invention. As discussed in the previous embodiments, the judgment module 2 includes the equivalent stabilized voltage generation circuit 28. The method of the invention further includes another step of voltage division and equivalent S411 executed before step S41, in which the equivalent stabilized voltage is generated after the stabilized voltage 122 has gone through voltage division via the equivalent stabilized voltage generation circuit 28. Then the equivalent stabilized voltage is compared with the first, second and third comparison voltages to judge the status of the power supply 1.

As a conclusion, the method and module for judging status of the power supply according to the invention mainly compares the stabilized voltage of the voltage stabilization and energy storage element in the power factor correction unit with the first, second and third comparison voltages to judge the status of the power supply, so that the motherboard can quickly get the status of the power supply to make corresponding loading regulation, thereby can resolve the problems of the conventional techniques such as delay notification, inaccurate judgment or complex composition of judgment circuit.

While the preferred embodiments of the invention have been set forth for the purpose of disclosure, they are not the limitations of the invention, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A method for judging status of power supplies each of which is electrically connected to a motherboard and includes a voltage stabilization and energy storage element located in a power factor correction unit to provide a stabilized voltage upon being activated and a pulse width control unit to drive the power supply to perform power conversion, the method comprising the steps of:

establishing comparison voltages: establishing a first comparison voltage, a second comparison voltage smaller than the first comparison voltage and a third comparison voltage smaller than the second comparison voltage;

getting the stabilized voltage: getting the stabilized voltage of the voltage stabilization and energy storage element during operation of the power supply;

judging external power supply: comparing the stabilized voltage with the first comparison voltage, and judging the external power supply in an abnormal state when the stabilized voltage is smaller than the first comparison voltage and generating an external power supply abnormal signal sent to the motherboard;

judging power supply performance: comparing the stabilized voltage with the second comparison voltage, and judging the power supply performance in an abnormal state when the stabilized voltage is smaller than the second comparison voltage and generating a power supply abnormal signal sent to the motherboard; and judging power failure: comparing the stabilized voltage with the third comparison voltage, and judging the power in a failure state when the stabilized voltage is smaller than the third comparison voltage and generating a power failure alert signal sent to the pulse width control unit.

2. The method of claim 1, wherein the step of establishing the comparison voltages is preceded by a step of generating the comparison voltages through voltage division by receiving a reference voltage to generate the first comparison voltage, the second comparison voltage and the third comparison voltage through a comparison voltage generation circuit.

3. The method of claim 1, wherein the step of establishing the comparison voltages further includes a step of generating the first comparison voltage through voltage division by receiving a reference voltage to generate the first comparison voltage through a first comparison voltage generation circuit.

4. The method of claim 1, wherein the step of establishing the comparison voltages further includes a step of generating the second comparison voltage through voltage division by receiving a reference voltage to generate the second comparison voltage through a second comparison voltage generation circuit.

5. The method of claim 1, wherein the step of establishing the comparison voltages further includes a step of generating the third comparison voltage through voltage division by receiving a reference voltage to generate the third comparison voltage through a third comparison voltage generation circuit.

6. The method of claim 1, wherein the step of getting the stabilized voltage further includes a voltage division and equivalent step by receiving the stabilized voltage to generate an equivalent stabilized voltage via voltage division through an equivalent stabilized voltage generation circuit.

7. A module for judging status of power supplies each of which is electrically connected to a motherboard and includes a voltage stabilization and energy storage element located in a power factor correction unit to provide a stabilized voltage upon being activated and a pulse width control unit to drive the power supply to perform power conversion, the module comprising:
an external power supply inspection unit which includes a first comparison voltage and is electrically connected to the voltage stabilization and energy storage element and the motherboard to receive the stabilized voltage of the voltage stabilization and energy storage element to compare with the first comparison voltage and generate an external power supply abnormal signal sent to the motherboard;
a power supply performance inspection unit which includes a second comparison voltage and is electrically connected to the voltage stabilization and energy storage element and the motherboard to receive the stabilized voltage of the voltage stabilization and energy storage element to compare with the second comparison voltage and generate a power supply abnormal signal sent to the motherboard; and
a power failure inspection unit which includes a third comparison voltage and is electrically connected to the voltage stabilization and energy storage element and the pulse width control unit to receive the stabilized voltage of the voltage stabilization and energy storage element to compare with the third comparison voltage and generate a power failure alert signal sent to the pulse width control unit.

8. The module for judging the status of the power supplies of claim 7 further including a comparison voltage generation circuit which is electrically connected to the external power supply inspection unit, the power supply performance inspection unit and the power failure inspection unit and receives a reference voltage from the power supply to respectively generate the first, second and third comparison voltages.

9. The module for judging the status of the power supplies of claim 7 further including a first comparison voltage generation circuit which is electrically connected to the external power supply inspection unit and receives a reference voltage from the power supply to generate the first comparison voltage through voltage division.

10. The module for judging the status of the power supplies of claim 7 further including a second comparison voltage generation circuit which is electrically connected to the power supply performance inspection unit and receives a reference voltage from the power supply to generate the second comparison voltage through voltage division.

11. The module for judging the status of the power supplies of claim 7 further including a third comparison voltage generation circuit which is electrically connected to the power failure inspection unit and receives a reference voltage from the power supply to generate the third comparison voltage through voltage division.

12. The module for judging the status of the power supplies of claim 7 further including an equivalent stabilized voltage generation circuit which is electrically connected to the voltage stabilization and energy storage element to receive the stabilized voltage and convert the stabilized voltage into an equivalent stabilized voltage through voltage division sent to the external power supply inspection unit, the power supply performance inspection unit and the power failure inspection unit.

13. The module for judging the status of the power supplies of claim 7, wherein the external power supply inspection unit is a logic circuit.

14. The module for judging the status of the power supplies of claim 7, wherein the external power supply inspection unit is a comparator.

15. The module for judging the status of the power supplies of claim 7, wherein the power supply performance inspection unit is a logic circuit.

16. The module for judging the status of the power supplies of claim 7, wherein the power supply performance inspection unit is a comparator.

17. The module for judging the status of the power supplies of claim 7, wherein the power failure inspection unit is a logic circuit.

18. The module for judging the status of the power supplies of claim 7, wherein the power failure inspection unit is a comparator.

* * * * *